United States Patent
Huang et al.

(10) Patent No.: US 12,336,272 B2
(45) Date of Patent: Jun. 17, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Chun-Hung Huang, Hsinchu (TW); Hsin-Che Chiang, Taipei (TW); Jeng-Ya Yeh, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 476 days.

(21) Appl. No.: 17/586,310

(22) Filed: Jan. 27, 2022

(65) Prior Publication Data
US 2023/0024357 A1  Jan. 26, 2023

Related U.S. Application Data

(60) Provisional application No. 63/225,239, filed on Jul. 23, 2021.

(51) Int. Cl.
| | |
|---|---|
| *H10D 84/03* | (2025.01) |
| *H01L 21/02* | (2006.01) |
| *H10D 30/01* | (2025.01) |
| *H10D 30/62* | (2025.01) |
| *H10D 84/01* | (2025.01) |
| *H10D 84/83* | (2025.01) |

(52) U.S. Cl.
CPC ..... *H10D 84/038* (2025.01); *H01L 21/02252* (2013.01); *H01L 21/02255* (2013.01); *H10D 30/024* (2025.01); *H10D 30/6211* (2025.01); *H10D 84/013* (2025.01); *H10D 84/0147* (2025.01); *H10D 84/0151* (2025.01); *H10D 84/0158* (2025.01); *H10D 84/834* (2025.01)

(58) Field of Classification Search
None
See application file for complete search history.

(56) References Cited

U.S. PATENT DOCUMENTS

| | | | |
|---|---|---|---|
| 8,334,197 B2 | 12/2012 | Lee et al. | |
| 9,093,530 B2 | 7/2015 | Huang et al. | |
| 9,171,929 B2 | 10/2015 | Lee et al. | |

(Continued)

*Primary Examiner* — Khaja Ahmad
(74) *Attorney, Agent, or Firm* — NZ Carr Law Office

(57) ABSTRACT

A method of forming a semiconductor device structure is provided. The method includes forming semiconductor fins at a first conductivity type region and a second conductivity type region of a substrate, forming a sacrificial gate structure across a portion of the semiconductor fins, wherein the sacrificial gate structure comprises a sacrificial gate dielectric layer and a sacrificial gate electrode layer over the sacrificial gate dielectric layer, and the sacrificial gate dielectric layer on the semiconductor fins of the first conductivity type region is asymmetrical in thickness between a top and a sidewall of the semiconductor fins. The method also includes forming a gate spacer on opposite sidewalls of the sacrificial gate structure, recessing the semiconductor fins not covered by the sacrificial gate structure and the gate spacer, forming source/drain feature on the recessed semiconductor fins, and removing the sacrificial gate structure to expose the top of the semiconductor fins.

20 Claims, 15 Drawing Sheets

(56) References Cited

U.S. PATENT DOCUMENTS

| | | | |
|---|---|---|---|
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2012/0306028 A1* | 12/2012 | Wang | H01L 29/518 257/411 |
| 2017/0317084 A1* | 11/2017 | Cantoro | H01L 21/823431 |
| 2018/0138173 A1* | 5/2018 | Chang | H01L 21/32138 |
| 2019/0139831 A1* | 5/2019 | Zhu | H10D 30/024 |
| 2019/0355823 A1* | 11/2019 | Lin | H01L 29/7856 |
| 2020/0027795 A1* | 1/2020 | Sung | H10D 64/021 |

* cited by examiner

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, portions of channel region of a transistor, such as fin field-effect transistor (FinFET), may be damaged during replacement of sacrificial gate structures and/or removal of native oxides that are formed as a result of various manufacturing processes, which can lead to poor device performance or failure. Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-15A are cross-sectional side views of various stages of manufacturing the semiconductor device structure of FIG. 8 taken along line A-A, in accordance with some embodiments.

FIGS. 9B-15B are cross-sectional side views of various stages of manufacturing the semiconductor device structure of FIG. 8 taken along line B-B, in accordance with some embodiments.

DETAILED DESCRIPTION

Figure 1:
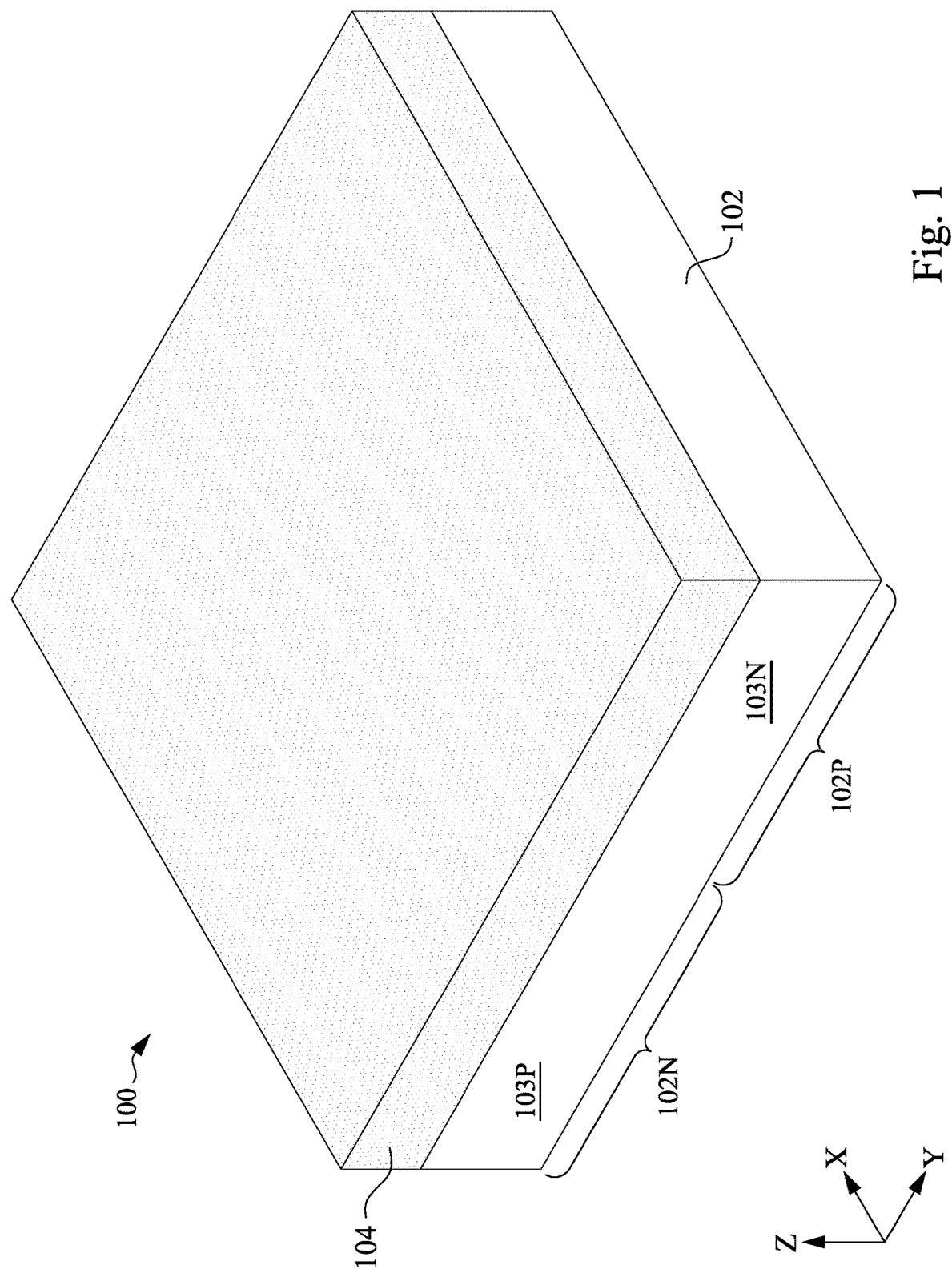
FIGS. 1-3 are perspective views of the semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-15B illustrate various stages of manufacturing a semiconductor device structure 100 in accordance with various embodiments of this disclosure. It is understood that additional operations can be provided before, during, and after processes shown by FIGS. 1-15B and some of the operations described below can be replaced or eliminated, for additional embodiments of the method. The order of the operations/processes may be interchangeable.

Figure 2:
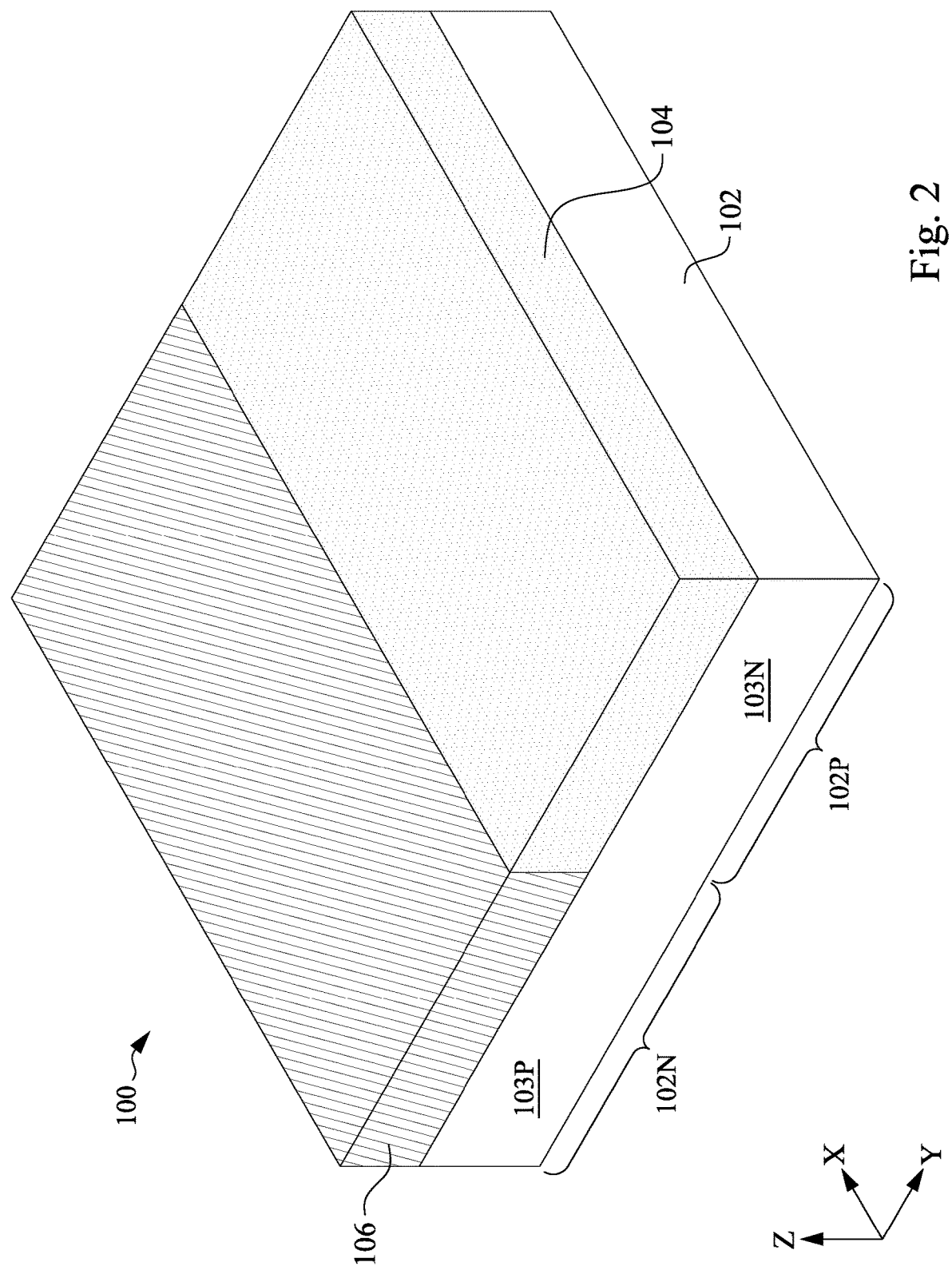
Figure 3:
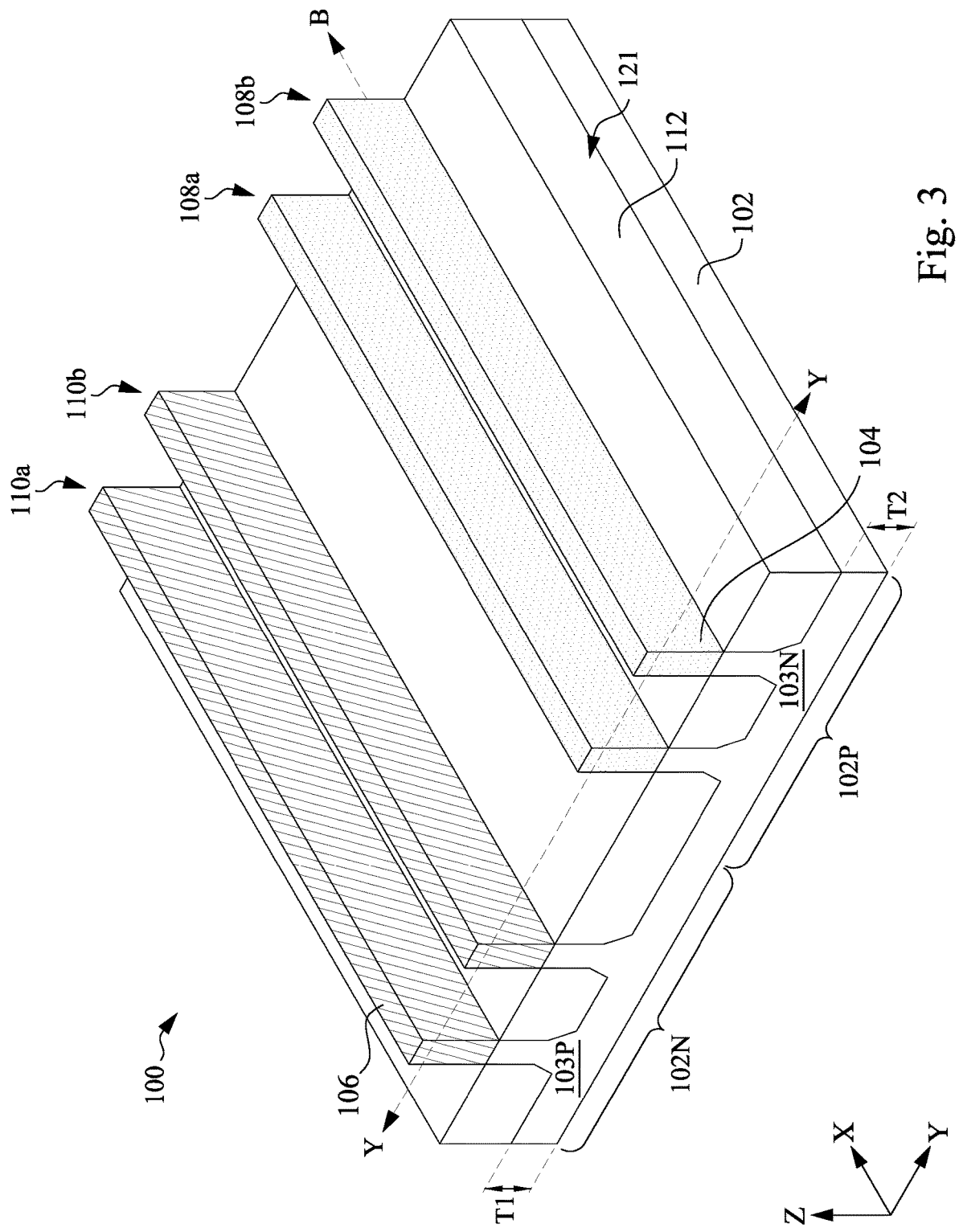

FIGS. 1-3 are perspective views of the semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type region 102P and an N-type region 102N adjacent to the P-type region 102P, and the P-type region 102P and N-type region 102N belong to a continuous substrate 102, in accordance with some embodiments. In some embodiments of the present disclosure, the P-type region 102P is used to form a PMOS device thereon, whereas the N-type region 102N is used to form an NMOS device thereon. In some embodiments, an N-well region 103N and a P-well region 103P are formed in the substrate 102, as shown in FIG. 1. For example, the N-well region 103N may be formed in the substrate 102 in the P-type region 102P, whereas the P-well region 103P may be formed in the substrate 102 in the N-type region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In one exemplary embodiment, the first semiconductor layer 104 is made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In one exemplary embodiment, the second semiconductor layer 106 is made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the N-type region 102N, and the second semiconductor layer 106 is disposed over the N-well region 103N in the P-type region 102P.

In some alternative embodiments, one of the fins 108a-b (e.g., fin 108a) in the N-type region 102N is formed of the second semiconductor layer 106, and the other fin 108b in the N-type region 102N is formed of the first semiconductor layer 104. In such cases, the subsequent S/D epitaxial features 152 formed on the fins 108a and 108b in the N-type region 102N may be Si or SiGe. In some alternative embodiments, the fins 108a-b and 110a-b are formed directly from a bulk substrate (e.g., substrate 102), which may be doped with P-type or N-type impurities to form well regions (e.g., P-well region 103P and N-well region 103N). In such cases, the fins are formed of the same material as the substrate 102. In one exemplary embodiment, the fins and the substrate 102 are formed of silicon.

Portions of the first semiconductor layer 104 may serve as channels in the subsequently formed NMOS device in the N-type region 102N. Portions of the second semiconductor layer 106 may serve as channels in the subsequently formed PMOS device in the P-type region 102P. In some embodiments, the NMOS device and the PMOS device are FinFETs. While embodiments described in this disclosure are described in the context of FinFETs, implementations of some aspects of the present disclosure may be used in other processes and/or in other devices, such as planar FETs, dual-gate FETs, tri-gate FETS, nanosheet channel FETs, forksheet FETs, Horizontal Gate All Around (HGAA) FETs, Vertical Gate All Around (VGAA) FETs, complementary FETs, negative-capacitance FETs, and other suitable devices.

In FIG. 3, a plurality of fins 108a, 108b, 110a, 110b are formed from the first and second semiconductor layers 104, 106, respectively, and STI regions 121 are formed. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

In some embodiments, the substrate 102 at the N-type region 102N may have a thickness different than the thickness at the P-type region 102P. Due to etch loading effects, the first semiconductor layer 104 (e.g., Si) deposited over the substrate 102 at the P-well region 103P and the second semiconductor layer 106 (e.g., SiGe) deposited over the substrate 102 at the N-well region 103N are etched at different rates when exposing to the same etchant used for patterning. The semiconductor material of the first semiconductor layer 104 may have a first etch rate by the etchant while the semiconductor material of the second semiconductor layer 106 may have a second etch rate by the etchant that is faster than the first etch rate. Therefore, portions of the substrate 102 not covered by the second semiconductor layer 106 at the N-well region 103N may be exposed and etched before the substrate 102 at the P-well region 103P is exposed. A difference in the substrate thickness between the N-well region 103N and the P-well region 103P is created as a result of the formation of the fins 108a, 108b, 110a, 110b. In cases where the first semiconductor layer 104 includes SiGe and the second semiconductor layer 106 includes Si, the substrate 102 at the N-well region 103N may have a thickness T1 measuring from a top surface of the substrate 102 to a bottom surface of the substrate 102, and the substrate 102 at the P-well region 103P may have a thickness T2 measuring from the top surface of the substrate 102 to the bottom surface of the substrate 102, wherein the thickness T2 is less than the thickness T1. In some embodiments, which can be combined with any other embodiment(s) in this disclosure, the difference in height between thickness T1 and thickness T2 may be in a range of about 0.1% to about 5%.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Next, an insulating material 112 is formed between adjacent fins 108a-b, 110a-b. The insulating material 112 may be first formed between adjacent fins 108a-b, 110a-b and over the fins 108a-b, 110a-b, so the fins 108a-b, 110a-b are embedded in the insulating material 112. A planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating material 112 are then recessed by removing a portion of the insulating material 112 located on both sides of each fin 108a-b, 110a-b. The insulating material 112 may be recessed by any suitable removal process, such as dry etch or wet etch that selectively removes the insulating material 112 but does not substantially affect the semiconductor materials of the fins 108a-b, 110a-b. The insulating material 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating material 112 may be formed by any suitable method, such as low-pressure chemical vapor deposition (LPCVD), plasma enhanced CVD (PECVD) or flowable CVD (FCVD). The insulating material 112 may be shallow trench isolation (STI) region, and is referred to as STI region 121 in this disclosure.

In some alternative embodiments, instead of forming first and second semiconductor layers 104, 106 over the substrate 102, the fins 108a-b, 110a-b may be formed by first forming isolation regions (e.g., STI regions 121) on a bulk substrate (e.g., substrate 102). The formation of the STI regions may include etching the bulk substrate to form trenches, and filling the trenches with a dielectric material to form the STI regions. The portions of the substrate between neighboring STI regions form the fins. The top surfaces of the fins and the top surfaces of the STI regions may be substantially level with each other by a CMP process. After the STI regions are formed, at least top portions of, or substantially entireties of, the fins are removed. Accordingly, recesses are formed between STI regions. The bottom surfaces of the STI regions may be level with, higher, or lower than the bottom surfaces of the STI regions. An epitaxy is then performed to separately grow first and second semiconductor layers (e.g., first and second semiconductor layers 104, 106) in the recesses created as a result of removal of the portions of the fins, thereby forming fins (e.g., fins 108a-b, 110a-b). A CMP is then performed until the top surfaces of the fins and the top surfaces of the STI regions are substantially co-planar. In some embodiments, after the epitaxy and the CMP, an implantation process is performed to define well regions (e.g., P-well region 103P and N-well region 103N) in the substrate. Alternatively, the fins are in-situ doped with impurities (e.g., dopants having P-type or N-type conductivity) during the epitaxy. Thereafter, the STI regions are recessed so that fins of first and second semiconductor layers (e.g., fins 108a-b, 110a-b) are extending upwardly over the STI regions from the substrate, in a similar fashion as shown in FIG. 3.

Figure 4:
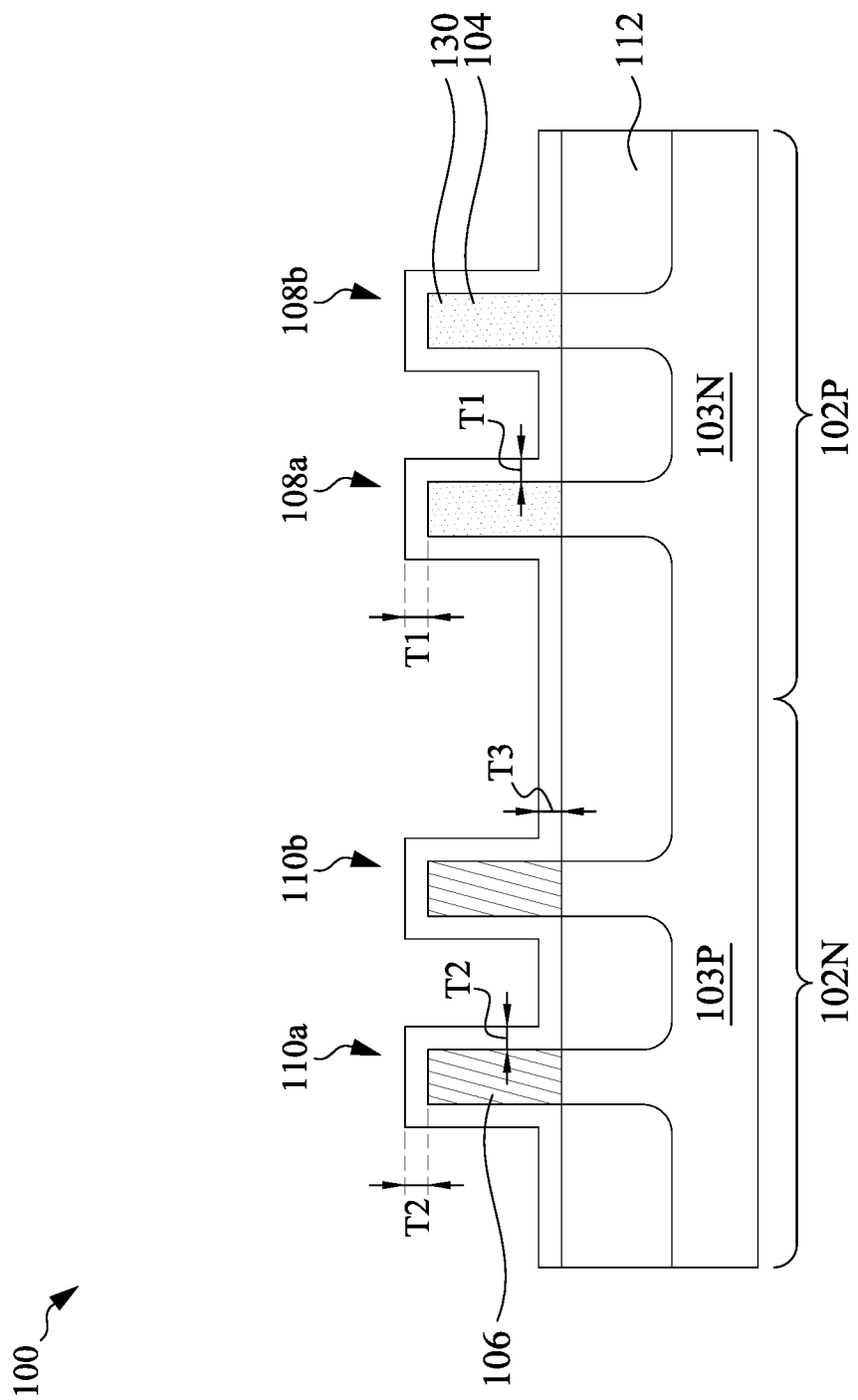
FIGS. 4-7 are cross-sectional side views of various stages of manufacturing the semiconductor device structure, in accordance with some embodiments.
Figure 5:
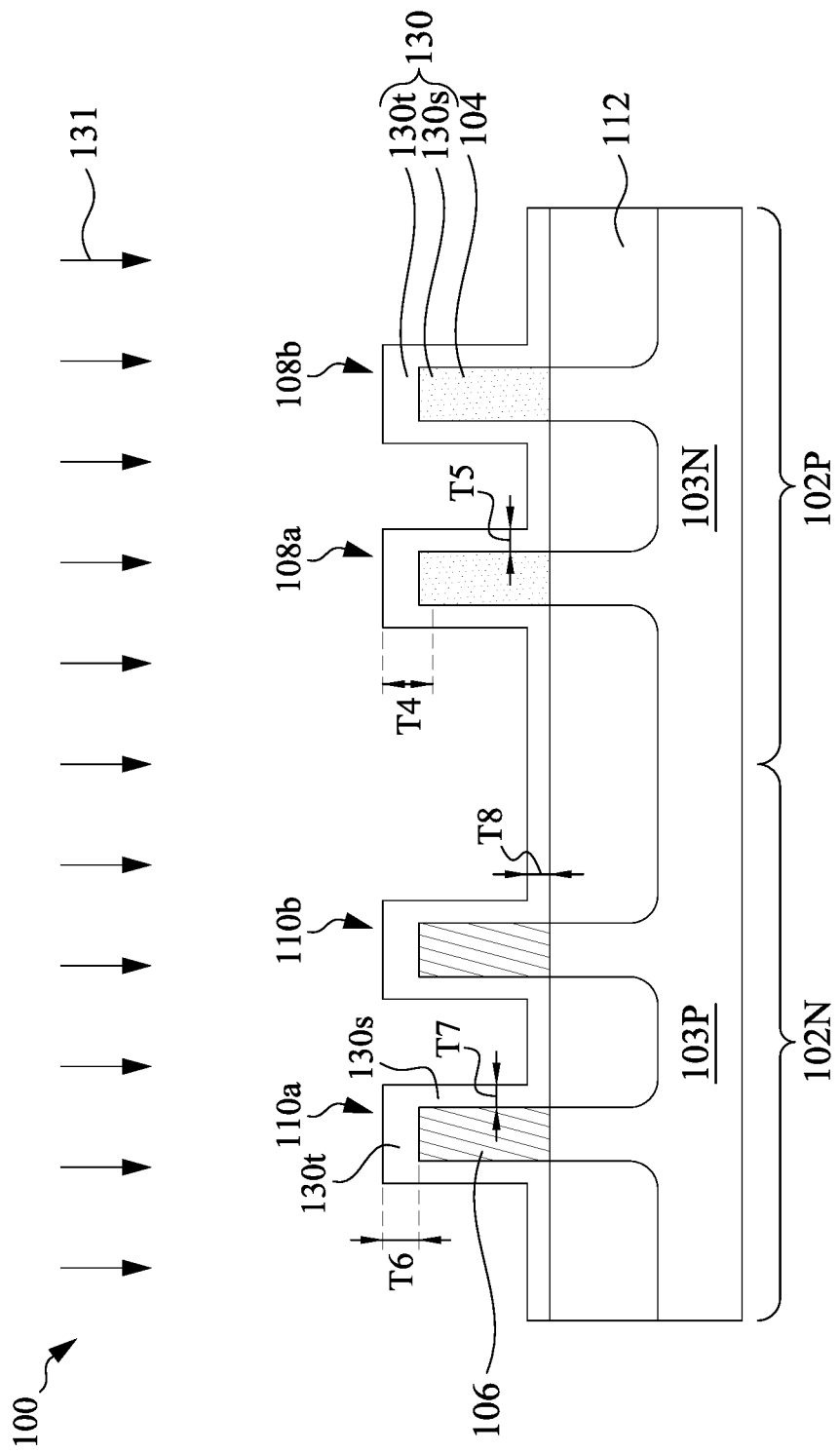

In FIG. 4, a sacrificial gate dielectric layer 130 of one or more sacrificial gate structures 128 (FIG. 8) are formed on a portion of the fins 108a-b, 110a-b and on the insulating material 112. The sacrificial gate dielectric layer 130 may include one or more layers of dielectric material, such as SiO$_2$, SiN, a high-K dielectric material, and/or other suitable dielectric material. In some embodiments, the sacrificial gate dielectric layer 130 includes a material different than that of the insulating material 112 or the high-K dielectric material 120. The sacrificial gate dielectric layer 130 may be formed by a blanket deposition using a thermal oxidation process, a thermal nitridation process, a plasma oxidation process, a plasma nitridation process, a CVD process, a sub-atmospheric CVD (SACVD) process, a FCVD process, an ALD process, a PVD process, or combinations thereof, or other suitable process.

In one exemplary embodiment, the sacrificial gate dielectric layer 130 is formed by the thermal oxidation process. During thermal oxidation process, a portion of the fins 108a, 108b, 110a, 110b is consumed and a thermal oxide layer (i.e., sacrificial gate dielectric layer 130) is formed (about 1.2 times to about 2.5 times the consumed fins). The thermal oxidation process forms and/or converts at least a portion of the fins 108a, 108b, 110a, 110b to semiconductor oxides. In cases where fins 108a, 108b include silicon germanium, a portion of the fins 108a, 108b is converted to the sacrificial gate dielectric layer 130 containing silicon germanium oxide. Likewise, in cases where fins 110a, 110b includes silicon, a portion of the fins 110a, 110b is converted to the sacrificial gate dielectric layer 130 containing silicon oxide. In cases where the insulating material 112 includes silicon oxide, the thermal oxidation process may also grow a silicon oxide layer (i.e., the sacrificial gate dielectric layer 130) on the surface of the insulating material 112. The thermal oxidation process may be conducted in oxygen ambient or in a combination of steam ambient and oxygen ambient (wet thermal oxidation). In one exemplary embodiment, the thermal oxidation process is performed in a H$_2$O ambient gas with a temperature ranging from about 500 degrees Celsius to about 600 degrees Celsius and under a pressure ranging from about 1 ATM to about 20 ATM.

In some embodiments, the thermal oxidation process is performed such that the fins 108a, 108b are oxidized at a rate faster than that of the fins 110a, 110b. Therefore, the sacrificial gate dielectric layer 130 on the fins 108a, 108b may have a thickness T1 and the sacrificial gate dielectric layer 130 on the fins 110a, 110b may have a thickness T2 that is less than the thickness T1. The sacrificial gate dielectric layer 130 on the insulating material 112 may have a thickness T3 that is less than the thickness T1 and T2. In some embodiments, the thermal oxidation process is performed such that the sacrificial gate dielectric layer 130 formed on the fins 108a, 108b, 110a, 110b is conformal and the thickness T1 and T2 are substantially identical.

Subsequent to the formation of the sacrificial gate dielectric layer 130, a plasma treatment 131 is performed on the sacrificial gate dielectric layer 130. The plasma treatment 131 may be a decoupled plasma oxidation process, a decoupled plasma nitridation process, a remote plasma oxidation, or a combination thereof. In some embodiments, the plasma treatment 131 is a decoupled plasma oxidation process. In some embodiments, the plasma treatment 131 is a combination of a decoupled plasma oxidation process and a decoupled plasma nitridation process, in which the decoupled plasma oxidation process is performed for a first period of time, followed by the decoupled plasma nitridation process for a second period of time that is greater or shorter than the first period of time.

In one exemplary embodiment, the sacrificial gate dielectric layer 130 is subjected to a decoupled plasma oxidation process. The decoupled plasma oxidation process facilitates forming the sacrificial gate dielectric layer 130 at a lower thermal budget. Particularly, the decoupled plasma oxidation process causes the thickness of the sacrificial gate dielectric layer 130t at the top of the fins 108a, 108b, 110a, 110b to increase at a greater oxidation rate than the thickness of the sacrificial gate dielectric layer 130s at the sidewalls of the fins 108a, 108b, 110a, 110b. Such difference in the oxidation rate may be a result of greater plasma exposure at the fin top than the sidewalls of the fins 108a, 108b, 110a, 110b. As a result of the decoupled plasma oxidation process, the sacrificial gate dielectric layer 130t at the top of the fins 108a, 108b is formed with a thickness T4 greater than a thickness T5 of the sacrificial gate dielectric layer 130s at the sidewalls of the fins 108a, 108b. In some embodiments, the thickness T4 and thickness T5 may have a ratio (T4:T5) of about 1.5:1 to about 3:1, for example about 1.7:1. In one example, the thickness T4 is about 2 Å to about 5 Å greater than the thickness T5. Likewise, the sacrificial gate dielectric layer 130t at the top of the fins 110a, 110b has a thickness T6 that is greater than a thickness T7 of the sacrificial gate dielectric layer 130s at the sidewalls of the fins 110a, 110b. In some embodiments, the thickness T6 and thickness T7 may have a ratio (T6:T7) of about 1.5:1 to about 3:1, for example about 1.7:1. In one example, the thickness T6 is about 2 Å to about 5 Å greater than the thickness T7. The sacrificial gate dielectric layer 130 as formed is asymmetrical in thickness on different surfaces of the exposed fins 108a, 108b, 110a, 110b. That is, the sacrificial gate dielectric layer 130 has a greater thickness (T4, T6) on the top of the fins 108a, 108b, 110a, 110b than the thickness (T5, T7) on the sidewalls of the fins 108a, 108b, 110a, 110b. The decoupled plasma oxidation process may also increase the thickness of the sacrificial gate dielectric layer 130 on the insulating material 112 so that it has a thickness T8 that is greater than the thickness T3 (FIG. 4). The term "asymmetrical" used herein refers to the sacrificial gate dielectric layer 130 having a thickness variation in different areas. Specifically, the thickness of the sacrificial gate dielectric layer 130 at the top of the fins 108a-b, 110a-b is different than the thickness at the sidewalls of the fins 108a-b, 110a-b.

As the top of the fins 108a, 108b, 110a, 110b may be consumed during removal of the sacrificial gate dielectric layer 130, which can prematurely expose the channel regions (e.g., fins 108a, 108b, 110a, 110b covered by the sacrificial gate structures 128 (FIG. 8)) and cause unwanted damage to the channel regions during the subsequent source/drain recess. Having an increased thickness of the sacrificial gate dielectric layer 130 at the top of the fins 108a, 108b, 110a, 110b can minimize the fin top loss at source/drain regions and protect the channel regions prior to and/or during the source/drain recess. In addition, the increased thickness T4 and T6 of the sacrificial gate dielectric layer 130t at the top of the fins 108a, 108b, 110a, 110b also helps protect the channel regions during replacement of the sacrificial gate structures. As such, the application of the plasma treatment 131 (e.g., decoupled plasma oxidation process) increases the oxygen content of the sacrificial gate dielectric layer 130, which results in an increase in thickness of the sacrificial gate dielectric layer 130. Particularly, the sacrificial gate dielectric layer 130 as deposited has an asymmetrical thickness profile between the top and sidewalls of the fins 108a, 108b, 110a, 110b. The asymmetry of thickness ensures nominal fin-to-fin spacing after treatment and minimize gate-induced drain leakage current (Igidl). As a result, the performance and reliability of the device is improved. Therefore, if the ratio (T4:T5) or the ratio (T6:T7) is less than about 1.5:1, the benefit of minimizing fin top loss might be diminished. On the other hand, if the ratio (T4:T5) or the ratio (T6:T7) is greater than about 3:1, the manufacturing cost is increased without significant advantage.

An exemplary decoupled plasma oxidation process may include exposing the semiconductor device structure 100 to a plasma formed from a pure $O_2$ gas, a pure $O_3$ gas, a gas mixture of $O_2$ and $O_3$ gas, a mixture of $O_2$ or $O_3$ gas and a noble gas (e.g., He, Ne, Ar, Kr, Xe, Rn), a mixture of $O_2$ or $O_3$ gas and hydrogen-containing gas, a mixture of $O_2$ or $O_3$ gas and nitrogen-containing gas, a mixture of $O_2$ or $O_3$ gas, a noble gas, and nitrogen-containing gas, or a mixture of $O_2$ or $O_3$ gas, a noble gas, a nitrogen-containing gas, and a hydrogen-containing gas. The plasma may be formed by a capacitively coupled plasma (CCP) source or an inductively coupled plasma (ICP) source driven by an RF power generator. In cases where ICP source is used, the plasma treatment 131 may be performed in a process chamber having a side wall, a ceiling, and a plasma source power applicator comprising a coil antenna disposed over the ceiling and/or around the side wall. The plasma source power applicator is coupled through an impedance match network to an RF power source, which may use a continuous wave RF power generator or a pulsed RF power generator operating on a predetermined duty cycle. In one exemplary embodiment, the decoupled plasma oxidation process is formed by the ICP source driven by the RF power generator using a tunable frequency ranging from about 2 MHz to about 13.56 MHz, and the chamber is operated at a pressure in a range of about 10 mTorr to about 20 Torr and a temperature of about 25 degrees Celsius to about 300 degrees Celsius for a process time of about 30 seconds to about 5 minutes. The RF power generator is operated to provide power between about 50 watts to about 2000 watts, and the output of the RF power generator is controlled by a pulse signal having a duty cycle in a range of about 20% to about 80%.

In some embodiments, which can be combined with one or more embodiments of this disclosures, the semiconductor device structure 100 is optionally subjected to a thermal treatment after the plasma treatment 131. The thermal treatment enhances the growth and/or film quality of the sacrificial gate dielectric layer 130. The thermal treatment may be performed in-situ at the process chamber where the plasma treatment 131 is performed. Alternatively, the thermal treatment may be performed in a rapid thermal chamber for annealing the sacrificial gate dielectric layer 130. In one embodiment, the semiconductor device structure 100 is heated to a temperature of about 350 degrees Celsius to about 1100 degrees Celsius for a duration of about 15 seconds to about 90 seconds. A nitrogen gas and/or an inert gas may be flowed into the process chamber or the rapid thermal chamber while the thermal treatment is performed.

Figure 6:
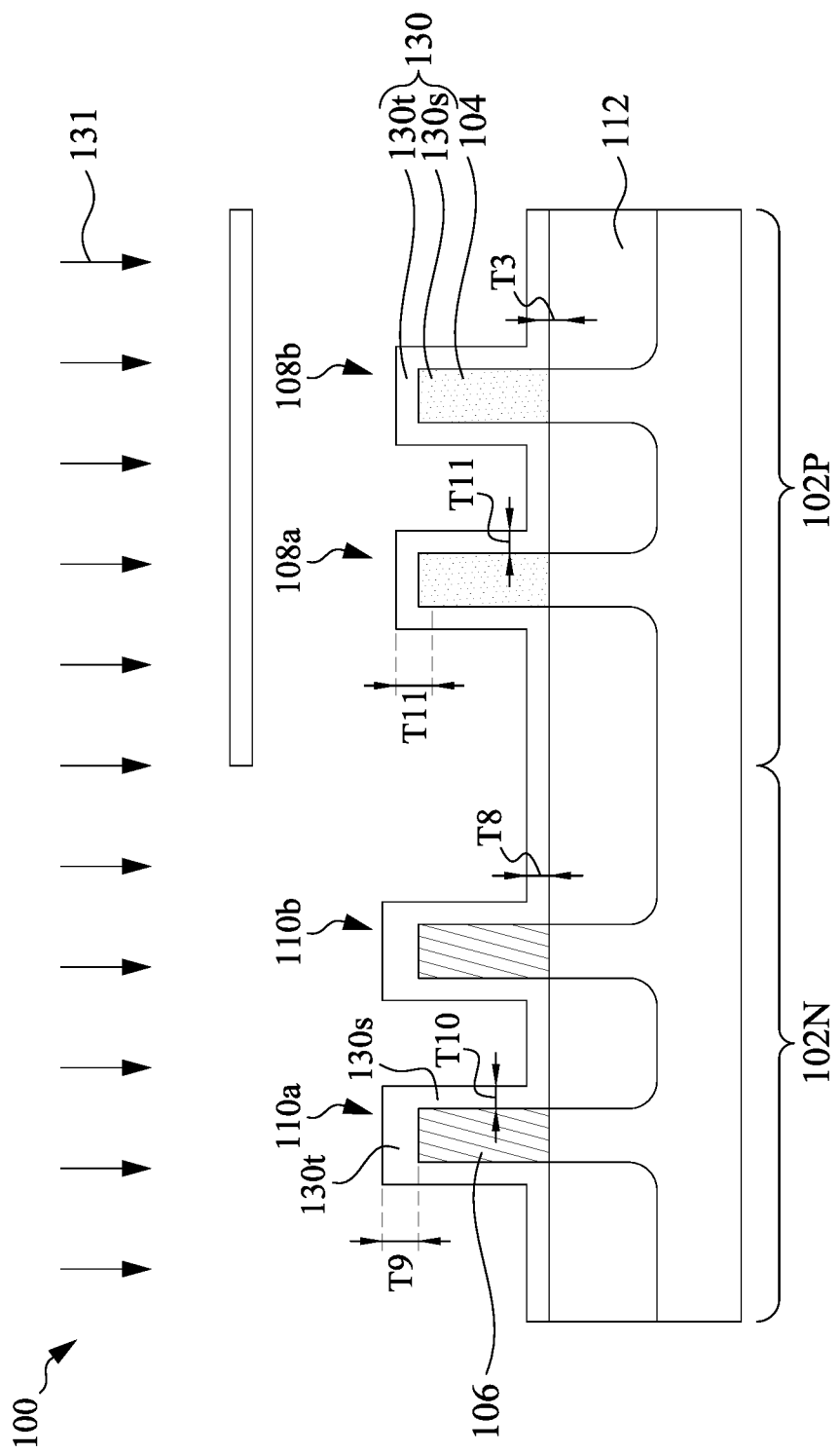

FIG. 6 is an alternative embodiment showing selective plasma treatment is performed after formation of the sacrificial gate dielectric layer 130. The selective plasma treatment allows only fins at certain regions (e.g., regions where the fin top loss is greater) of the semiconductor device structure 100 to have an increased thickness of the sacrificial gate dielectric layer 130, while the sacrificial gate dielectric layer 130 on the fins at other regions remain untreated. This can be advantageous as the fins at N-type and/or P-type regions can be selectively treated with multi-threshold voltage tuning capability. The selective plasma treatment may be achieved through the use of a mask, which can be any suitable photomask, to block plasma exposure in selected areas. For example, in one exemplary embodiment shown in FIG. 6, a mask 133 is provided to protect the fins 108a, 108b disposed over the P-well region 103P, and the fins 110a, 110b disposed over the N-well region 103N are exposed. The selective plasma treatment may use the plasma treatment 131 as discussed above, such as a decoupled plasma oxidation process. As a result of the selective plasma treatment, the sacrificial gate dielectric layer 130t at the top of the fins 110a, 110b in the N-type region 102N, which is exposed to the decoupled plasma oxidation process, has a thickness T9 that is greater than the thickness T10 of the sacrificial gate dielectric layer 130s at the sidewalls of the fins 110a, 110b (i.e., asymmetric thickness profile), and the thickness T9 of the sacrificial gate dielectric layer 130t at the top of the fins 110a, 110b is greater than the thickness T11 of the sacrificial gate dielectric layer 130t at the top of the fins 108a, 108b, which are located at the P-type region 102P being protected from plasma treatment. The sacrificial gate dielectric layer 130s at the sidewalls of the fins 108a, 108b is substantially identical to the thickness T11 (i.e., symmetric thickness profile) due to non-exposure to the plasma treatment 131. The term "symmetric" used herein refers to the sacrificial gate dielectric layer 130 is formed with a uniform thickness having a thickness variation of less than about 1%. Specifically, the thickness of the sacrificial gate dielectric layer 130 at the top of the fins 108a-b, 110a-b is substantially identical to the thickness at the sidewalls of the fins 108a-b, 110a-b. After the selective plasma treatment, the semiconductor device structure 100 may be subjected to the thermal treatment discussed above.

While the embodiments discussed herein include forming the sacrificial gate dielectric layer 130, followed by the plasma treatment 131 and optional thermal treatment, in some embodiments the bare fins 108a, 108b, 110a, 110b may be subjected to the plasma treatment 131 directly and optional thermal treatment without forming the sacrificial gate dielectric layer 130 on the fins 108a, 108b, 110a, 110b and the insulating material 112.

Figure 7:
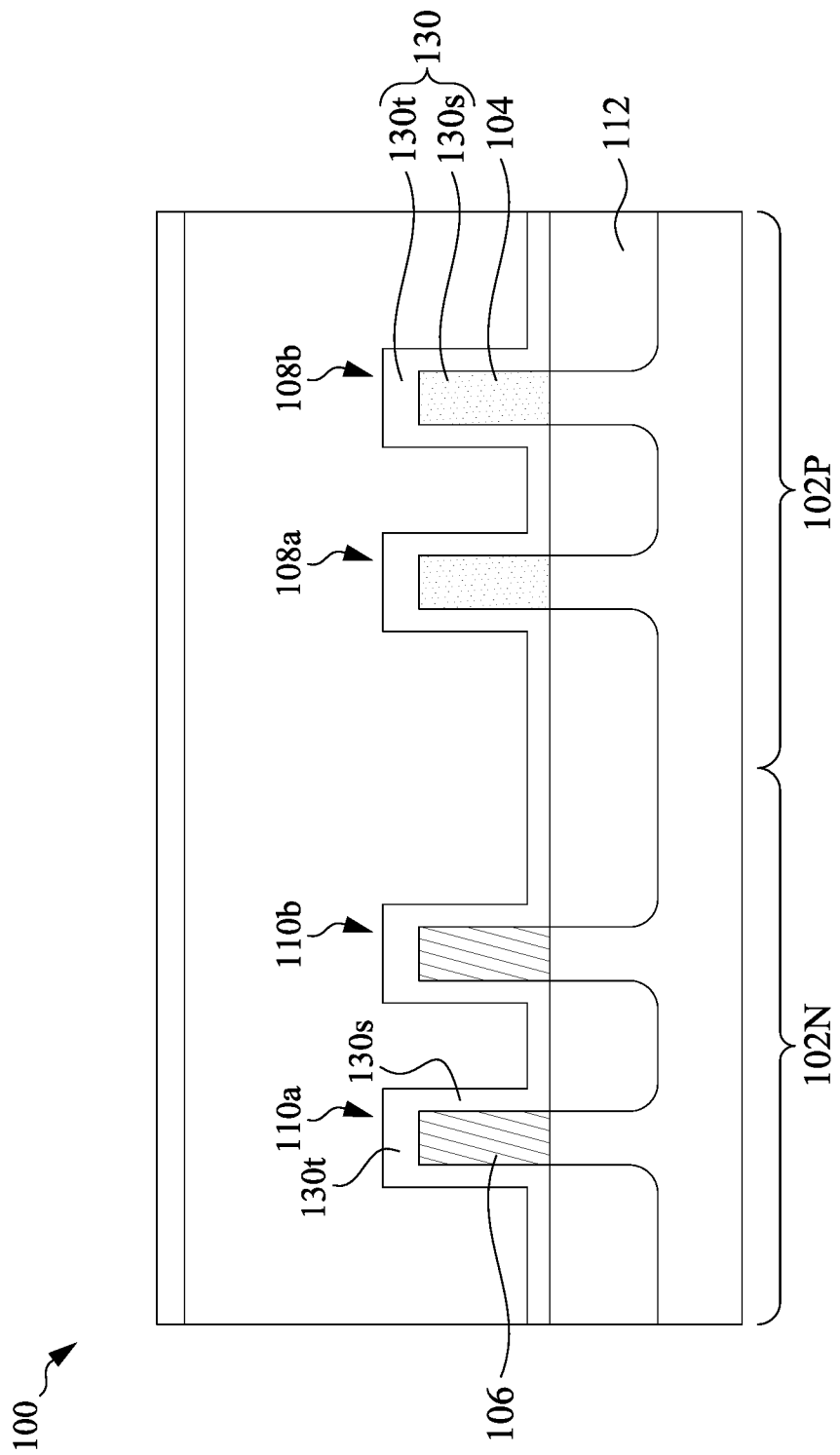

In FIG. 7, after the sacrificial gate dielectric layer 130 is treated with plasma, a sacrificial gate electrode layer 132 and a mask structure 134 are sequentially formed on the sacrificial gate dielectric layer 130 by a blanket deposition method. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

Figure 8:
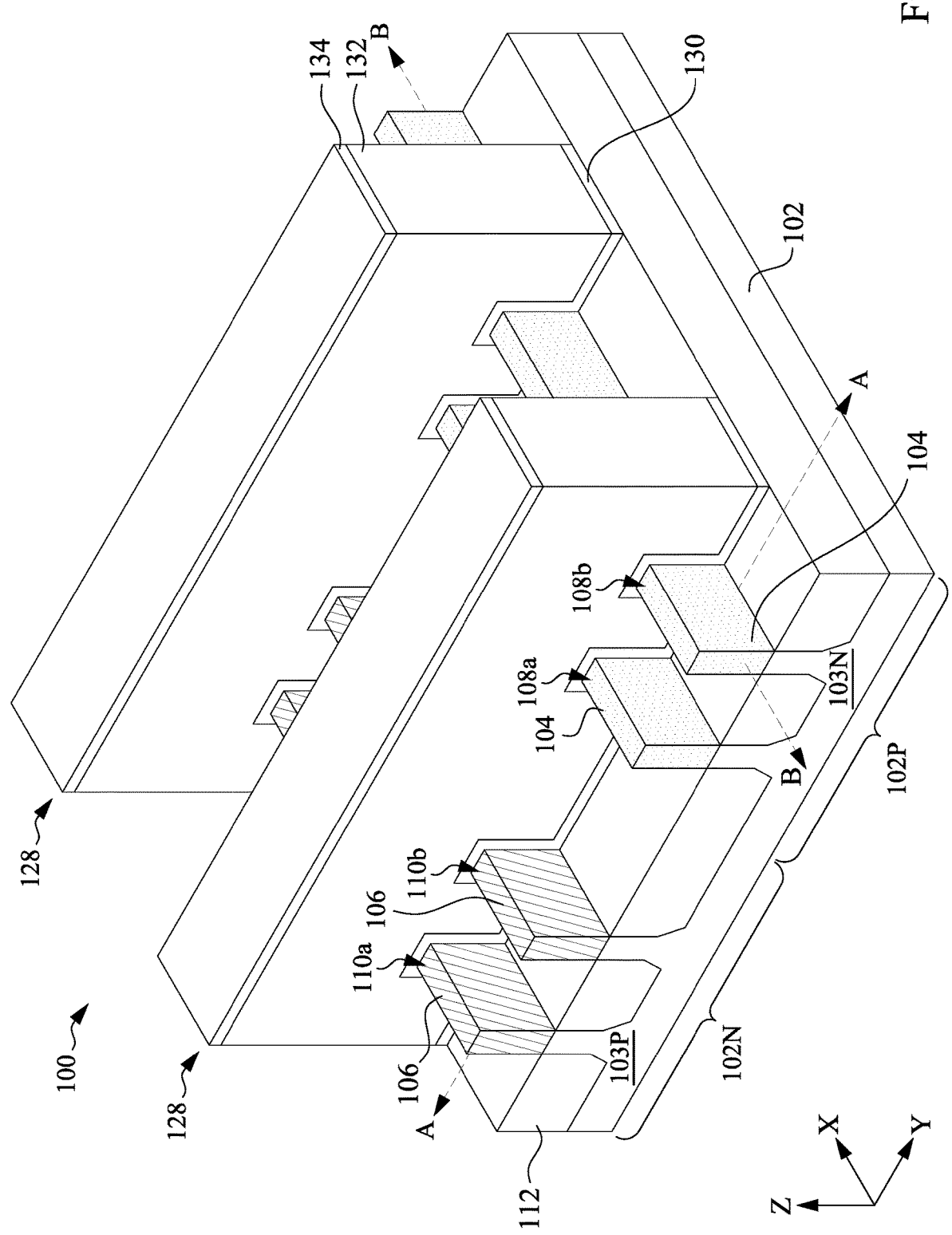
FIG. 8 is a perspective view of one stage of manufacturing a semiconductor device structure, in accordance with some embodiments

FIG. 8 is a perspective view of one stage of manufacturing a semiconductor device structure 100, in accordance with some embodiments. In FIG. 8, after the sacrificial gate electrode layer 132 and the mask structure 134 are formed, pattern and etch processes are performed to form sacrificial gate structures 128. The pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etch process may include dry etch (e.g., RIE), wet etch, other etch methods, and/or combinations thereof. While two sacrificial gate structures 128 are shown in FIG. 8, it can be appreciated that any number of the sacrificial gate structures 128 may be formed.

By patterning the sacrificial gate structures 128, the fins 108a-b, 110a-b are partially exposed on opposite sides of the sacrificial gate structures 128. Particularly, the increased thickness of the sacrificial gate dielectric layers 130 on the top of the fins 108a-b, 110a-b at the source/drain regions avoids premature consumption of the top of the fins 108a-b, 110a-b and expose the channel regions underneath the sacrificial gate structures 128 during patterning and etching of the sacrificial gate structures 128. The sacrificial gate dielectric layer 130 on the top of the fins 108a-b, 110a-b under the sacrificial gate structures 128 remains the asymmetric thickness profile after patterning and etching of the sacrificial gate structures 128.

FIGS. 9A-15A are cross-sectional side views of various stages of manufacturing the semiconductor device structure 100 of FIG. 8 taken along line A-A, in accordance with some embodiments. FIGS. 9B-15B are cross-sectional side views of various stages of manufacturing the semiconductor device structure 100 of FIG. 8 taken along line B-B, in accordance with some embodiments.

Figure 9A:
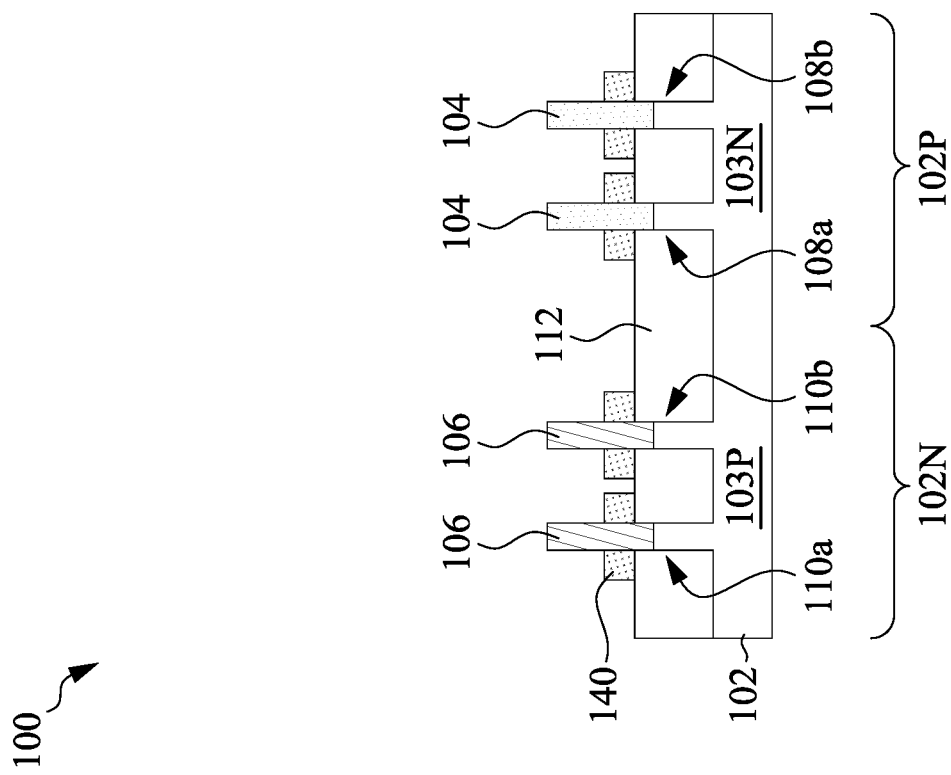
Figure 9B:
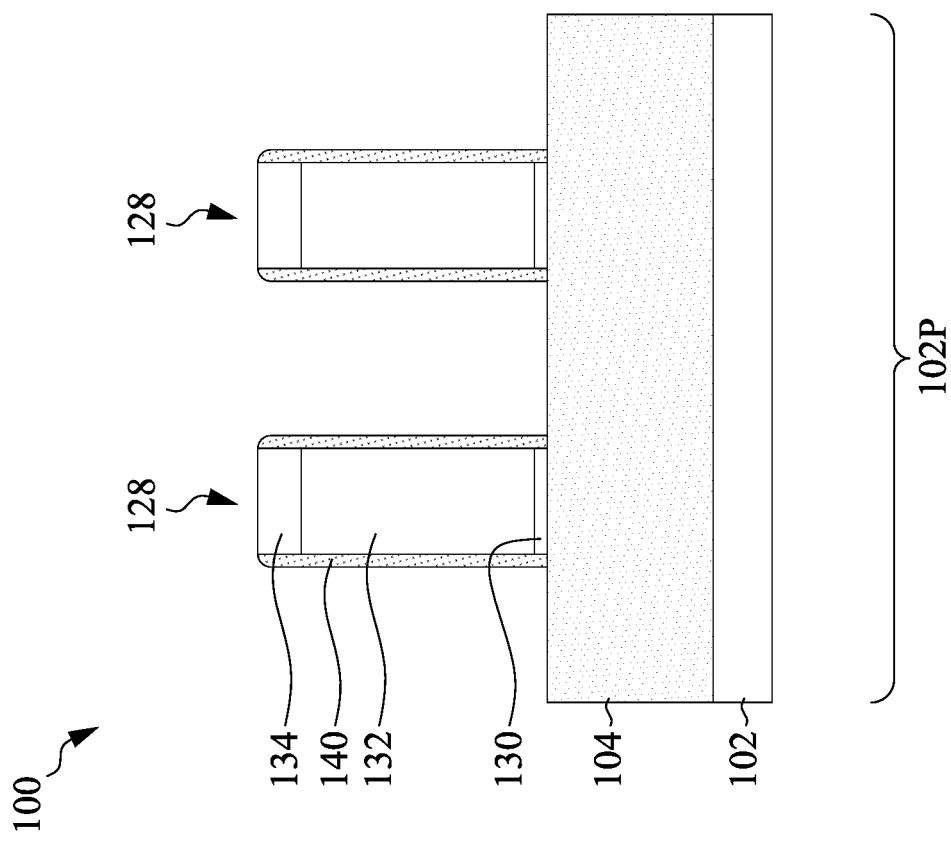

In FIGS. 9A-9B, a spacer 140 is formed on the sacrificial gate structures 128 and the exposed portions of the first and second semiconductor layers 104, 106. The spacer 140 may be conformally deposited on the exposed surfaces of the semiconductor device structure 100. The conformal spacer 140 may be formed by ALD or any suitable processes. An anisotropic etch is then performed on the spacer 140 using, for example, RIE. During the anisotropic etch process, most of the spacer 140 is removed from horizontal surfaces, such as tops of the sacrificial gate structures 128 and tops of the fins 108a-b, 110a-b, leaving the spacer 140 on the vertical surfaces, such as on opposite sidewalls of the sacrificial gate structures 128. The spacers 140 may partially remain on opposite sidewalls of the fins 108a-b, 110a-b, as shown in FIG. 9A. In some embodiments, the spacers 140 formed on the source/drain regions of the fins 108a-b, 110a-b are fully removed.

The spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the spacer 140 include one or more layers of the dielectric material discussed herein.

Figure 10A:
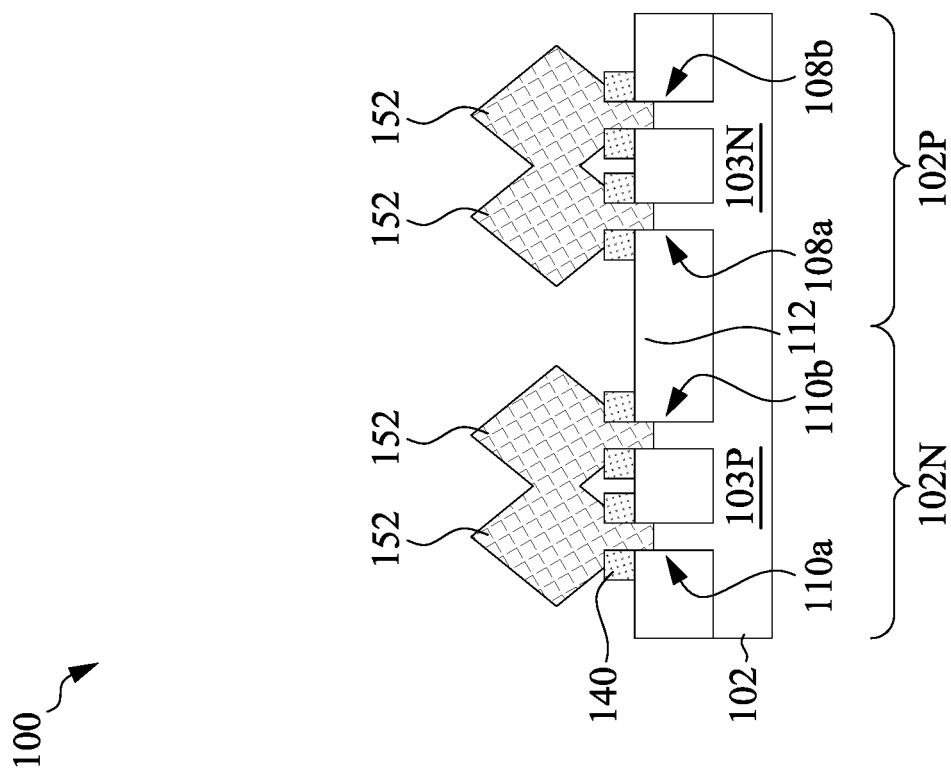
Figure 10B:
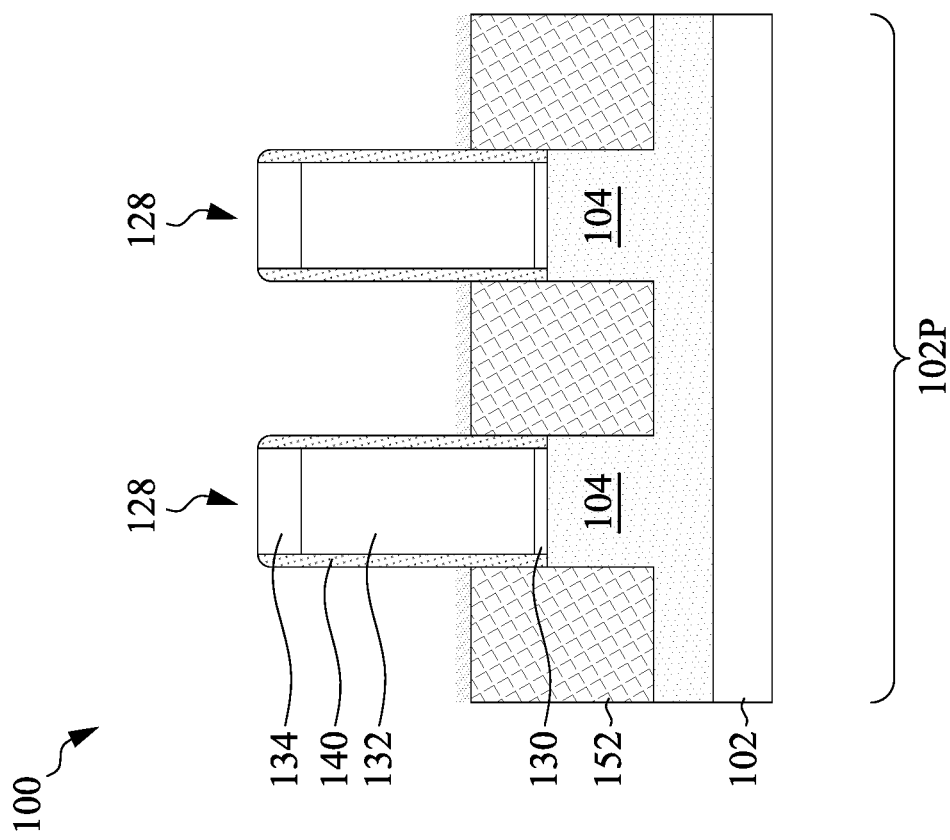

In FIGS. 10A-10B, the first and second semiconductor layers 104, 106 of the fins 108a-b, 110a-b not covered by the sacrificial gate structures 128 and the spacers 140 are recessed, and source/drain (S/D) epitaxial features 152 are formed. For n-channel FETs, the epitaxial S/D features 152 may include one or more layers of Si, SiP, SiC, SiCP, or a group III-V material (InP, GaAs, AlAs, InAs, InAlAs, InGaAs). In some embodiments, the epitaxial S/D features 152 may be doped with n-type dopants, such as phosphorus (P), arsenic (As), etc, for n-type devices. For p-channel FETs, the epitaxial S/D features 152 may include one or more layers of Si, SiGe, SiGeB, Ge, or a group III-V material (InSb, GaSb, InGaSb). In some embodiments, the epitaxial S/D features 152 may be doped with p-type dopants, such as boron (B). The epitaxial S/D features 152 may grow both vertically and horizontally to form facets, which may correspond to crystalline planes of the material used for the substrate 102. The epitaxial S/D features 152 may be formed by an epitaxial growth method using CVD, ALD or MBE.

In some embodiments, the portions of the first semiconductor layer 104 on both sides of each sacrificial gate structure 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 of the fins 108a-108b and 110a-110b are merged, as shown in FIG. 10A. The S/D epitaxial features 152 may each have a top surface at a level higher than a top surface of the first semiconductor layer 104, as shown in FIG. 10B.

Figure 11A:
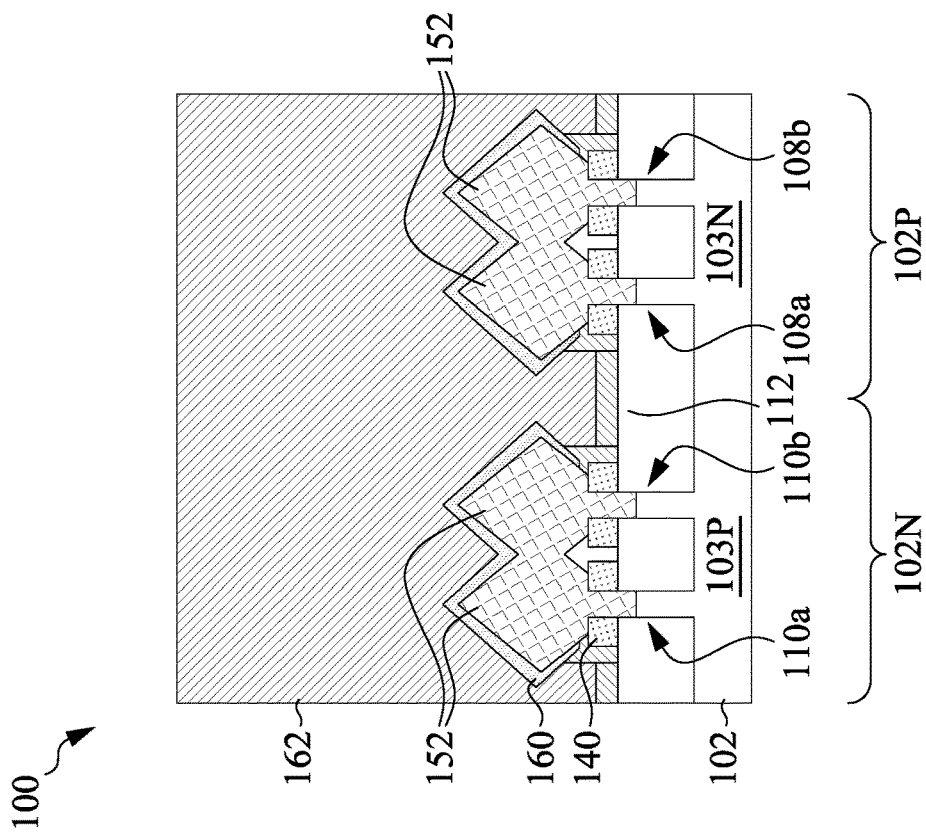
Figure 11B:
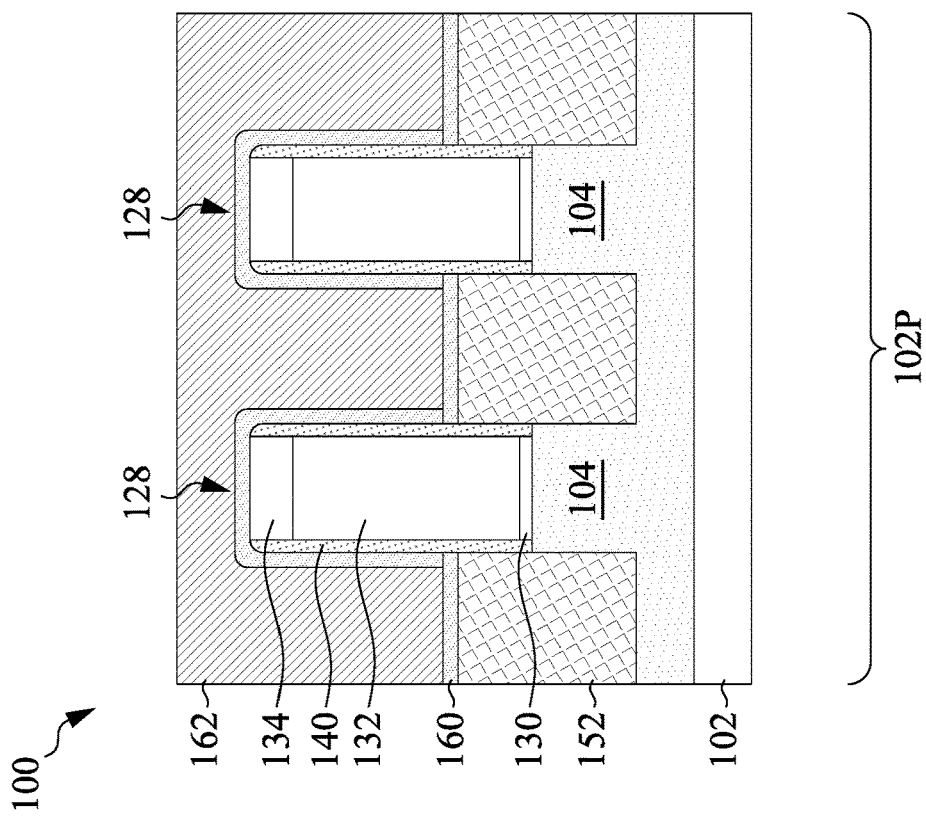

In FIGS. 11A-11B, a contact etch stop layer (CESL) 160 is conformally formed on the exposed surfaces of the semiconductor device structure 100. The CESL 160 covers the sidewalls of the sacrificial gate structures 128, the insulating material 112, and the S/D epitaxial features 152. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) 162 is formed on the CESL 160. The materials for the first ILD 162 may include compounds comprising Si, O, C, and/or H, such as tetraethylorthosilicate (TEOS) oxide, un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD 162 may be deposited by a PECVD process or other suitable deposition technique. In some embodiments, after formation of the first ILD 162, the semiconductor device structure 100 may be subject to a thermal process to anneal the first ILD 162. After formation of the first ILD 162, a planarization process is performed to expose the sacrificial gate electrode layer 132. The planarization process may be any suitable process, such as a CMP process. The planarization process removes portions of the first ILD 162 and the CESL 160 disposed on the sacrificial gate structures 128. The planarization process may also remove the mask structure 134.

Figure 12A:
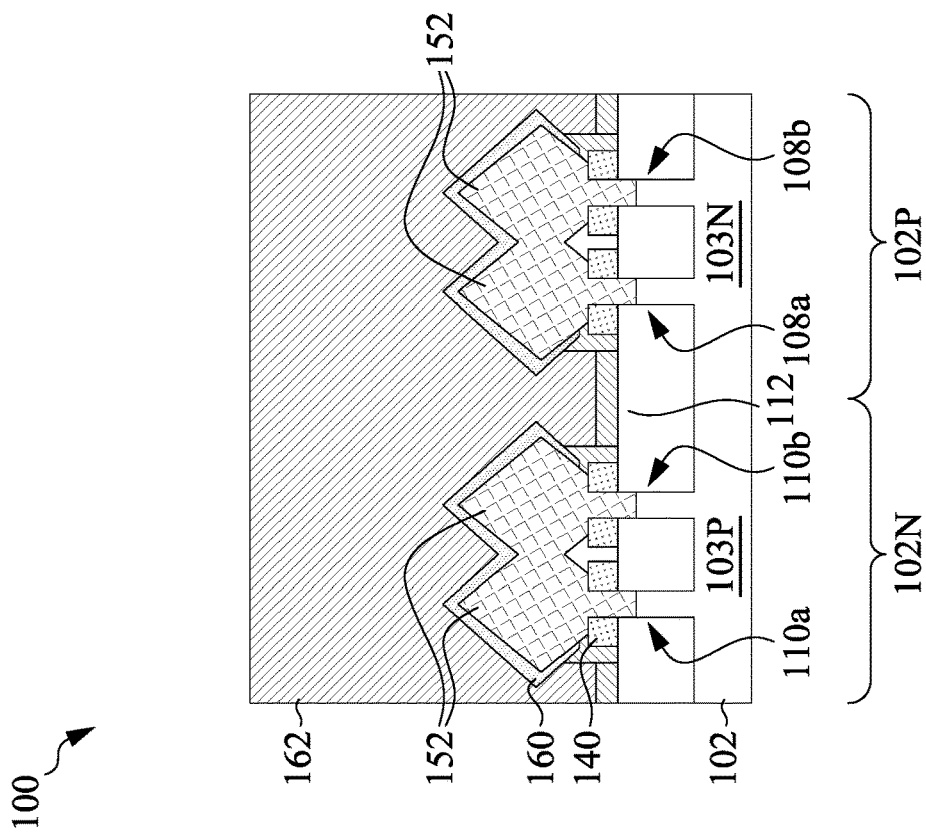
Figure 12B:
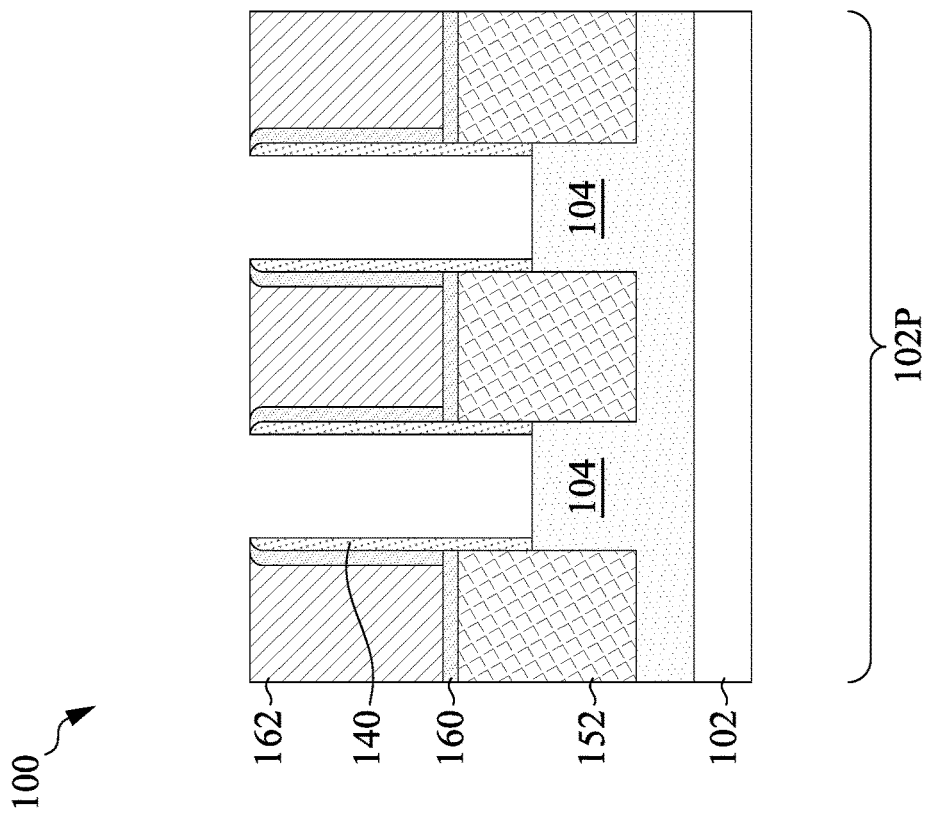

In FIGS. 12A-12B, the mask structure 134 (if not removed during CMP process), the sacrificial gate electrode layers 132 (FIG. 11B), and the sacrificial gate dielectric layers 130 (FIG. 11B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the first ILD 162. The removal of the sacrificial gate electrode layers 132 and the sacrificial gate dielectric layers 130 exposes a top portion of the first and second semiconductor layers 104, 106 (only first semiconductor layers 104 can be seen in FIGS. 12A and 12B) in the channel region. As the sacrificial gate dielectric layers 130 on the fins 108a-b, 110a-b have an increased thickness, the top of the fins 108a-b, 110a-b under the sacrificial gate structures 128 is protected during the one or more etch processes.

Figure 13A:
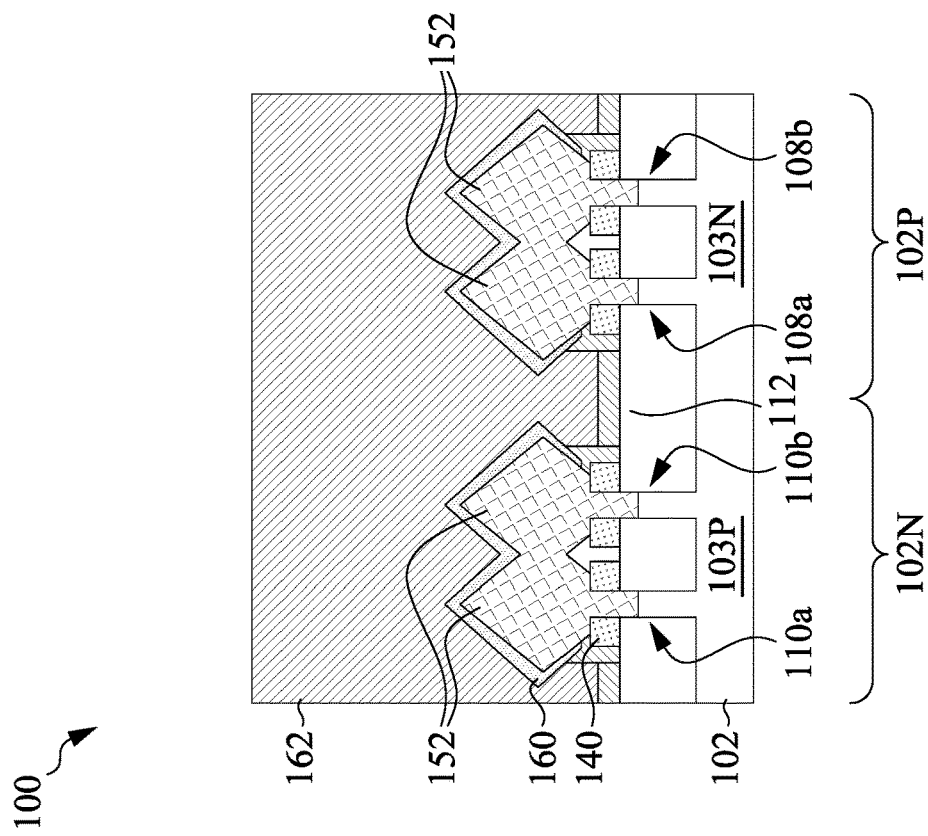
Figure 13B:
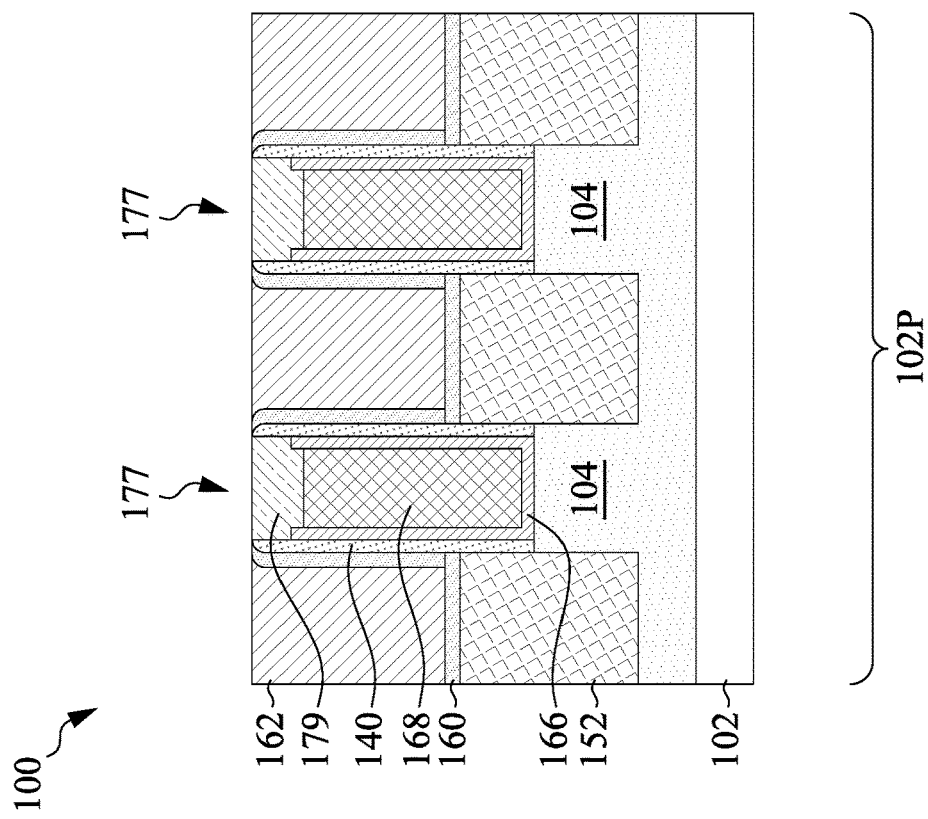
Figure 14A:
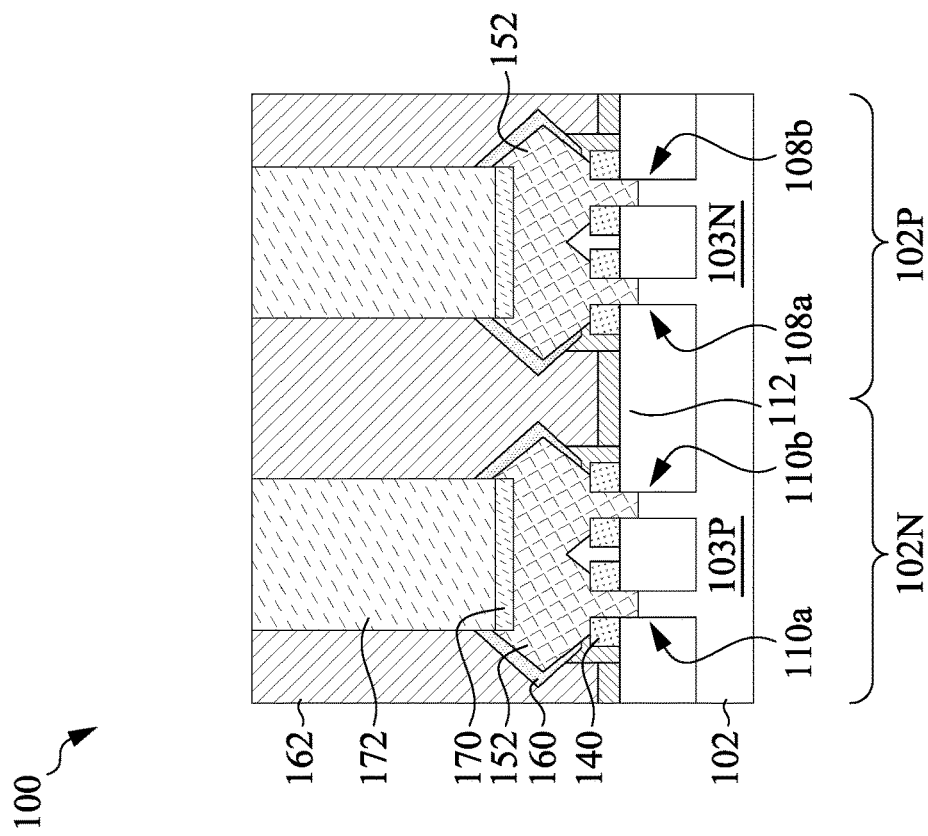
Figure 14B:
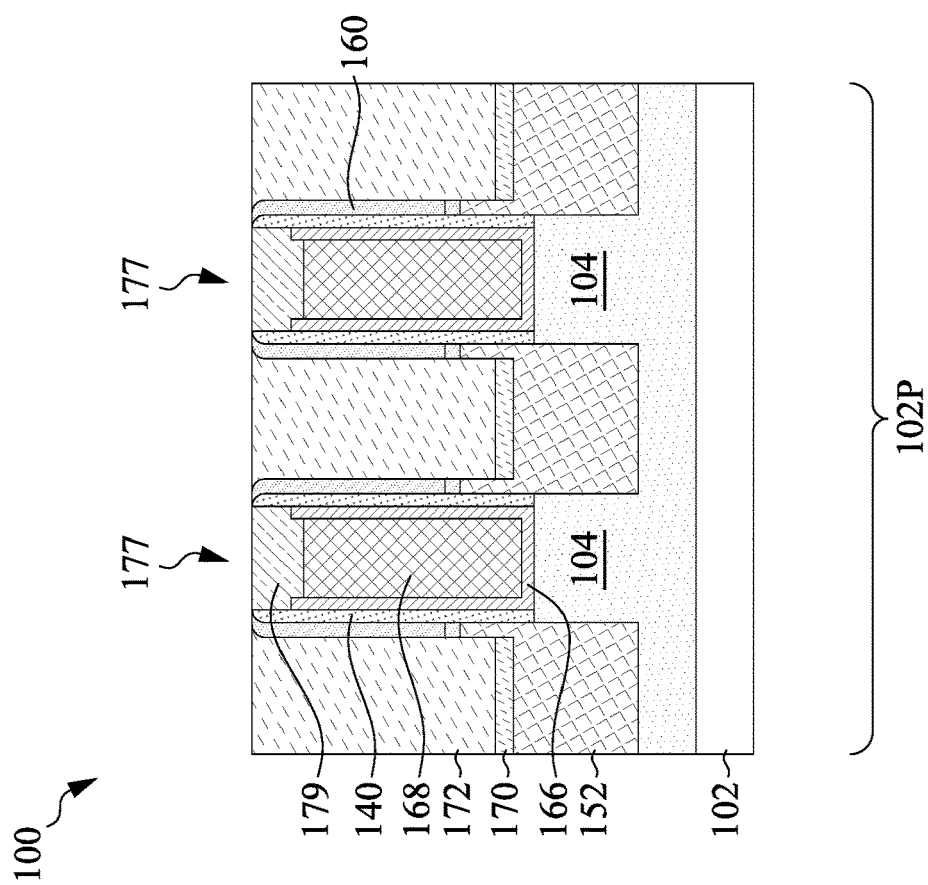

In FIGS. 13A-13C, replacement gate structures 177 are formed. The replacement gate structure 177 may include a gate dielectric layer 166 and a gate electrode layer 168 formed on the gate dielectric layer 166. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168 may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or combinations thereof. For devices in the N-type region 102N, the gate electrode layer 168 may be AlTiO, AlTiC, or a combination thereof. For devices in the P-type region 102P, the gate electrode layer 168 may be AlTiO, AlTiC, AlTiN, or a combination thereof. The gate electrode layers 168 may be formed by PVD, CVD, ALD, electro-plating, or other suitable method.

Optionally, a metal gate etching back (MGEB) process is performed to remove portions of the gate dielectric layer 166 and the gate electrode layer 168. The MGEB process may be a plasma etching process employing one or more etchants such as chlorine-containing gas, a bromine-containing gas, and/or a fluorine-containing gas. After the MGEB process, a top surface of the gate electrode layer 168 is lower than a top surface of the gate dielectric layer 166. Then, trenches formed above the gate dielectric layer 166 and the gate electrode layer 168 as a result of the MGEB processes are filled with a self-aligned contact (SAC) layer 179. The SAC layer 179 can be formed of any dielectric material that has different etch selectivity than the CESL 160 and serves as an etch stop layer during subsequent trench and via patterning for metal contacts. A CMP process is then performed to remove excess deposition of the SAC layer 179 until the top surface of the first ILD 162 is exposed.

In FIGS. 13A-13C, portions of the first ILD 162 and the CESL 160 disposed on both sides of the replacement gate structures 177 are removed. The removal of the portions of the first ILD 162 and the CESL 160 forms a contact opening exposing the S/D epitaxial features 152. In some embodiments, the upper portion of the exposed S/D epitaxial features 152 is removed. A conductive feature 172 (i.e., S/D contacts) is then formed in the contact openings over the S/D epitaxial features 152. The conductive feature 172 may include an electrically conductive material, such as one or more of Ru, Mo, Co, Ni. W, Ti, Ta, Cu, Al, TiN and TaN. The conductive feature 172 may be formed by any suitable process, such as PVD, CVD, ALD, electro-plating, or other suitable method. A silicide layer 170 may be formed between each S/D epitaxial feature 152 and the conductive feature 172. The silicide layer 170 conductively couples the S/D epitaxial features 152 to the conductive feature 172. The silicide layer 170 is a metal or metal alloy silicide, and the metal includes a noble metal, a refractory metal, a rare earth metal, alloys thereof, or combinations thereof. For n-channel FETs, the silicide layer 170 may include one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 170 may include one or more of NiSi, CoSi, MnSi, Wsi, FeSi, RhSi, PdSi, RuSi, PtSi, IrSi, OsSi, or combinations thereof. Once the conductive features 172 are formed, a planarization process, such as CMP, is performed on the semiconductor device structure 100 until the top surface of the SAC layer 179 (if used) is exposed.

Figure 15A:
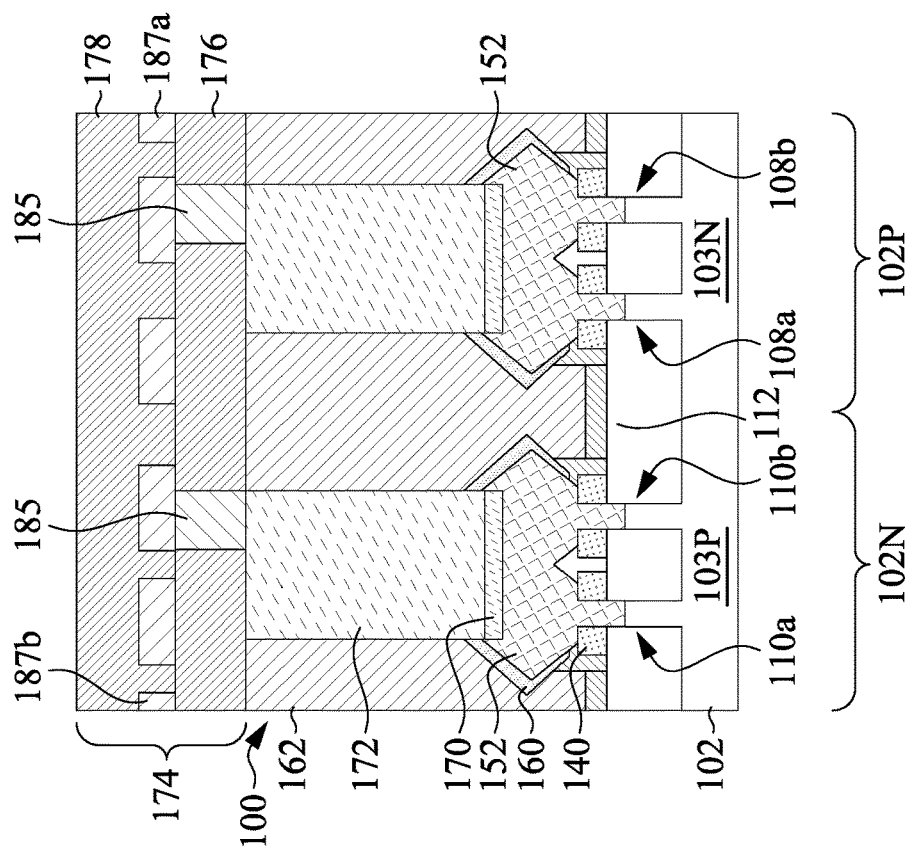
Figure 15B:
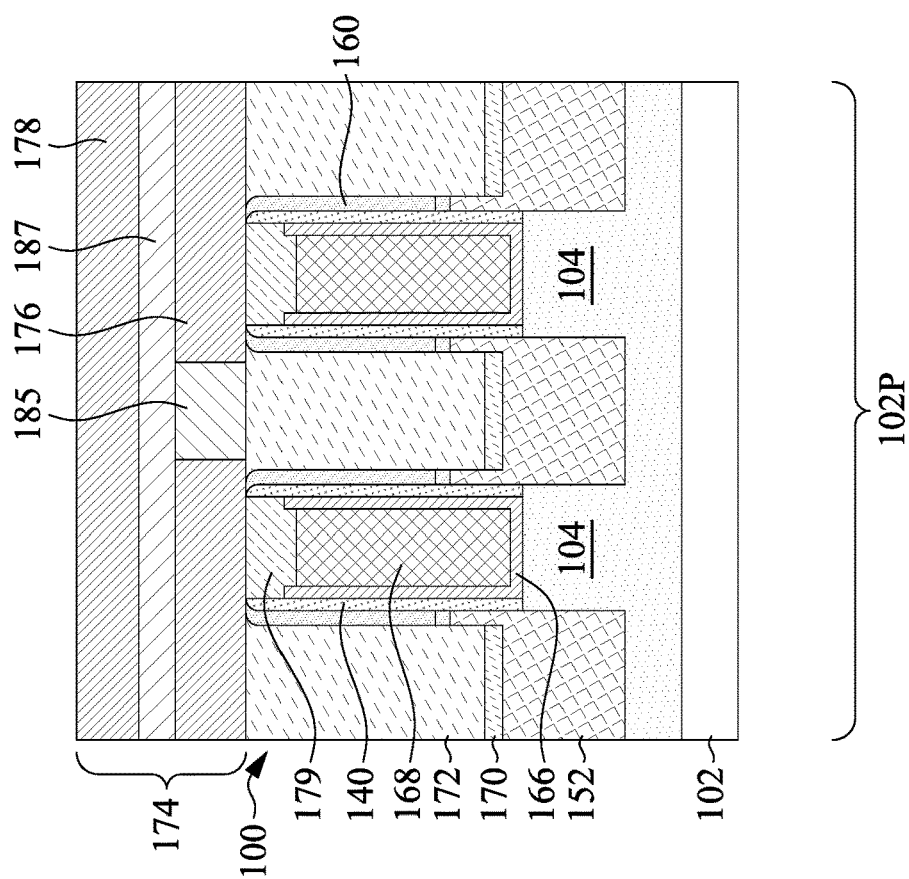

In FIGS. 15A-15B, an interconnect structure 174 is formed over the semiconductor device structure 100. The interconnect structure 174 may include one or more interlayer dielectrics and a plurality of interconnect features formed in each interlayer dielectric. In one exemplary embodiment, the interconnect structure 174 includes a second ILD 176 and a third ILD layer 178 formed over the second ILD 176, and a plurality of vertical interconnect features 185, such as vias, and horizontal interconnect features 187, such as metal lines, embedded in the second and third ILDs 176, 178, respectively. The vertical interconnect features 185 are selectively formed to provide electrical connection to some of the S/D contacts (e.g., conductive feature 172). The horizontal interconnect features 187 are formed to selectively provide electrical connection between the S/D contacts in the N-type region 102N and the P-type region 102P. In some embodiments, a conductive via (not shown) can be formed through the second ILD 176 and the SAC layer 179 to electrically connect the gate electrode layer (e.g., gate electrode layer 168*p*) to the horizontal interconnect features 187. The conductive via 189, the vertical interconnect features 185, and the horizontal interconnect features may include or be formed of W, Ru, Co, Cu, Ti, TiN, Ta, TaN, Mo, Ni, or combinations thereof. The second and third ILD 176, 178 may be formed of the same material as the first ILD 162.

A power rail (not shown) may be formed in the third ILD layer 178 and configured to be in electrical connection with the S/D epitaxial features 152 through the S/D contacts (e.g., conductive feature 172), the vertical interconnect feature 185, and the horizontal interconnect features 187. Depending on the application and/or conductivity type of the devices in the N-type region 102N and the P-type region 102P, the power rail may be fed with a positive voltage (VDD) or a negative voltage (VSS) (i.e., ground or zero voltage). For example, the VDD may be provided to the horizontal interconnect features 187*a* and the VSS may be provided to the horizontal interconnect features 187*b*, as shown in FIG. 15A.

The present disclosure provides an improved process to minimize fin top loss during the manufacturing process of a FinFET structure by treating a sacrificial gate dielectric layer with a plasma prior to source/drain recess so that a thickness at the top of semiconductor fins is greater than a thickness at the sidewalls of the semiconductor fins. The increased thickness at the top of the semiconductor fins also helps protect channel regions during replacement of the sacrificial gate structures. The asymmetric thickness profile of the sacrificial gate dielectric layer on the semiconductor fins ensures nominal fin-to-fin spacing and minimize gate-induced drain leakage current (Igidl). As a result, the performance and reliability of the device is improved.

An embodiment is a method for forming a semiconductor device structure. The method includes forming semiconductor fins at a first conductivity type region and a second conductivity type region of a substrate, forming a sacrificial gate structure across a portion of the semiconductor fins, wherein the sacrificial gate structure comprises a sacrificial gate dielectric layer and a sacrificial gate electrode layer over the sacrificial gate dielectric layer, and the sacrificial gate dielectric layer on the semiconductor fins of the first conductivity type region is asymmetrical in thickness between a top and a sidewall of the semiconductor fins. The method also includes forming a gate spacer on opposite sidewalls of the sacrificial gate structure, recessing the semiconductor fins not covered by the sacrificial gate structure and the gate spacer, forming source/drain feature on the recessed semiconductor fins, and removing the sacrificial gate structure to expose the top of the semiconductor fins.

Another embodiment is a method. The method includes forming semiconductor fins on a substrate, forming an isolation region between adjacent semiconductor fins so that a portion of the semiconductor fins protrudes over the isolation region, forming a sacrificial gate dielectric layer on the semiconductor fins, wherein the sacrificial gate dielectric layer has a first thickness at a top of the semiconductor fins and a second thickness at a sidewall of the semiconductor fins, subjecting a first portion of the sacrificial gate dielectric layer to a plasma treatment so that the first thickness is increased to a third thickness and the second thickness is increased to a fourth thickness less than the third thickness, forming a sacrificial gate electrode layer on the sacrificial gate dielectric layer, removing portions of the sacrificial gate electrode layer and the sacrificial gate dielectric layer to expose the semiconductor fins, recessing the semiconductor fins not covered by the sacrificial gate electrode layer and the sacrificial gate dielectric layer, and forming source/drain feature on the recessed semiconductor fins.

A further embodiment is a method. The method includes forming a first semiconductor fin at a first conductivity type region of a substrate and a second semiconductor fin at a second conductivity type region of the substrate, wherein the second conductivity type region is different from the first conductivity type region, forming a conformal sacrificial gate dielectric layer on the first and second semiconductor fins by a blanket deposition, wherein the sacrificial gate dielectric layer has a first thickness at a top of the first and second semiconductor fins and a second thickness at a sidewall of the first and second semiconductor fins, subjecting the sacrificial gate dielectric layer on the first semiconductor fin to a plasma treatment so that the first thickness on the first semiconductor fin is increased to a third thickness and the second thickness on the first semiconductor fin is increased to a fourth thickness less than the third thickness, forming a sacrificial gate electrode layer on the sacrificial gate dielectric layer, removing portions of the sacrificial gate electrode layer and the sacrificial gate dielectric layer to expose the first and third semiconductor fins, recessing the first and second semiconductor fins not covered by the sacrificial gate electrode layer and the sacrificial gate dielectric layer, forming source/drain feature on the recessed first and second semiconductor fins, removing the sacrificial gate electrode layer and the sacrificial gate dielectric layer to expose the top of the first and second semiconductor fins, and forming a replacement gate structure in a region formed as a result of removal of the sacrificial gate electrode layer and the sacrificial gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
    forming semiconductor fins at a first conductivity type region and a second conductivity type region of a substrate;
    forming a sacrificial gate structure across a portion of the semiconductor fins, wherein the sacrificial gate structure comprises a sacrificial gate dielectric layer and a sacrificial gate electrode layer over the sacrificial gate dielectric layer wherein the sacrificial gate dielectric layer is subjected to a selective treatment so that the sacrificial gate dielectric layer on the semiconductor fins of the first conductivity type region is asymmetrical in thickness between a top and a sidewall of the semiconductor fins, while the sacrificial gate dielectric layer on the semiconductor fins of the second conductivity type region is symmetrical in thickness between the top and the sidewall of the semiconductor fins;

forming a gate spacer on opposite sidewalls of the sacrificial gate structure;

recessing the semiconductor fins not covered by the sacrificial gate structure and the gate spacer;

forming source/drain feature on the recessed semiconductor fins; and removing the sacrificial gate structure to expose the top of the semiconductor fins.

2. The method of claim 1, wherein the sacrificial gate dielectric layer has a first thickness at the top of the semiconductor fins and a second thickness at the sidewall of the semiconductor fins, and the first thickness is greater than the second thickness.

3. The method of claim 2, wherein the selective treatment is a plasma treatment using a gas mixture comprising an oxygen-containing gas and a noble gas.

4. The method of claim 3, wherein the plasma treatment is performed using an inductively coupled plasma (ICP) source.

5. The method of claim 4, wherein the plasma treatment is a decoupled plasma oxidation process.

6. The method of claim 3, wherein the sacrificial gate dielectric layer is subjected to a thermal treatment after the plasma treatment.

7. A method for forming a semiconductor device structure, comprising:

forming semiconductor fins on a substrate;

forming an isolation region between adjacent semiconductor fins so that a portion of the semiconductor fins protrudes over the isolation region;

forming a sacrificial gate dielectric layer on the semiconductor fins, wherein the sacrificial gate dielectric layer has a first thickness at a top of the semiconductor fins and a second thickness at a sidewall of the semiconductor fins;

subjecting a first portion of the sacrificial gate dielectric layer to a plasma treatment while blocking a second portion of the sacrificial gate dielectric layer from plasma exposure so that the first thickness is increased to a third thickness and the second thickness is increased to a fourth thickness less than the third thickness;

forming a sacrificial gate electrode layer on the sacrificial gate dielectric layer;

removing portions of the sacrificial gate electrode layer and the sacrificial gate dielectric layer to expose the semiconductor fins;

recessing the semiconductor fins not covered by the sacrificial gate electrode layer and the sacrificial gate dielectric layer; and forming source/drain feature on the recessed semiconductor fins.

8. The method of claim 7, wherein the third thickness and the fourth thickness has a ratio (third thickness: fourth thickness) of about 1.5:1 to about 3:1.

9. The method of claim 7, wherein the plasma treatment is a decoupled plasma oxidation process.

10. The method of claim 7, wherein the plasma treatment comprises a decoupled plasma oxidation process and a decoupled plasma nitridation process.

11. The method of claim 7, wherein the plasma treatment uses a plasma formed from a gas mixture comprising a noble gas and $O_2$ and/or $O_3$ gas.

12. The method of claim 11, wherein the gas mixture further comprises a hydrogen-containing gas.

13. The method of claim 7, further comprising:

after the plasma treatment, subjecting the sacrificial gate dielectric layer to a thermal treatment.

14. The method of claim 13, wherein the sacrificial gate dielectric layer is exposed to a nitrogen gas and/or an inert gas during the thermal treatment.

15. A method for forming a semiconductor device structure, comprising:

forming a first semiconductor fin at a first conductivity type region of a substrate and a second semiconductor fin at a second conductivity type region of the substrate, wherein the second conductivity type region is different from the first conductivity type region;

forming a conformal sacrificial gate dielectric layer on the first and second semiconductor fins by a blanket deposition, wherein the sacrificial gate dielectric layer has a first thickness at a top of the first and second semiconductor fins and a second thickness at a sidewall of the first and second semiconductor fins;

subjecting the sacrificial gate dielectric layer on the first semiconductor fin to a plasma treatment so that the first thickness on the first semiconductor fin is increased to a third thickness and the second thickness on the first semiconductor fin is increased to a fourth thickness less than the third thickness, and the first and second thickness of the sacrificial gate dielectric layer on the second semiconductor fin remain substantially unchanged after the plasma treatment;

forming a sacrificial gate electrode layer on the sacrificial gate dielectric layer;

removing portions of the sacrificial gate electrode layer and the sacrificial gate dielectric layer to expose the first and second semiconductor fins;

recessing the first and second semiconductor fins not covered by the sacrificial gate electrode layer and the sacrificial gate dielectric layer; and forming source/drain feature on the recessed first and second semiconductor fins.

16. The method of claim 15, wherein the plasma treatment is a decoupled plasma oxidation process.

17. The method of claim 15, wherein the third thickness is greater than the fourth thickness by about 2 Å to about 5 Å.

18. The method of claim 1, wherein the selective treatment is performed using a mask to block plasma exposure in selected areas.

19. The method of claim 7, wherein the sacrificial gate dielectric layer at the second portion has a substantially uniform thickness at a top and a sidewall of the semiconductor fins after the plasma treatment.

20. The method of claim 13, wherein the plasma treatment and the thermal treatment are performed in-situ at the same process chamber.

* * * * *